(12) United States Patent
Logue et al.

(10) Patent No.: US 6,737,925 B1
(45) Date of Patent: May 18, 2004

(54) METHOD AND APPARATUS FOR CONTROLLING SUPPLY VOLTAGE LEVELS FOR INTEGRATED CIRCUITS

(75) Inventors: John D. Logue, Placerville, CA (US); Andrew R. Percey, San Jose, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/253,275

(22) Filed: Sep. 24, 2002

(51) Int. Cl.[7] .............................................. G11C 7/00
(52) U.S. Cl. ........................................ 331/2; 365/227
(58) Field of Search ................................ 331/2, 113 R, 331/185; 365/227

(56) References Cited

U.S. PATENT DOCUMENTS 5,604,466 A * 2/1997 Dreps et al. ............ 331/113 R
6,100,766 A * 8/2000 Segawa et al. ................ 331/2
6,172,932 B1 * 1/2001 Kim ............................ 365/227
2003/0056124 A1 * 3/2003 Amick et al. ............... 713/300

OTHER PUBLICATIONS

NA80122631, Chip Performance Regulator Using On Chip Voltage Controlled Oscillator, Dec. 1980, IBM Technical Disclosure Bulletin, p. 2631–2632.*

* cited by examiner

Primary Examiner—Robert Pascal
Assistant Examiner—Joseph Chang
(74) Attorney, Agent, or Firm—Eric Webostad

(57) ABSTRACT

Method and apparatus for providing a controlled voltage to an integrated circuit is described. A first frequency value indicative of a first voltage is compared to a second frequency value indicative of a second voltage. The second frequency value is adjusted by the second voltage until the second frequency value is within a range of the first frequency value. Additionally, the second voltage may be adjusted to maintain the second frequency value within the range.

23 Claims, 4 Drawing Sheets

METHOD AND APPARATUS FOR CONTROLLING SUPPLY VOLTAGE LEVELS FOR INTEGRATED CIRCUITS

FIELD OF THE INVENTION

One or more aspects of the present invention relate generally to voltage control, and more particularly to controlling internal voltage supply levels provided to integrated circuits.

BACKGROUND OF THE INVENTION

Programmable logic devices (PLDS) exist as a well-known type of integrated circuit (IC) that may be programmed by a user to perform specified logic functions. There are different types of programmable logic devices, such as programmable logic arrays (PLAS) and complex programmable logic devices (CPLDs). One type of programmable logic devices, called a field programmable gate array (FPGA), is very popular because of a superior combination of capacity, flexibility, time-to-market, and cost. An FPGA typically includes an array of configurable logic blocks (CLBs) surrounded by a ring of programmable input/output blocks (IOBs). The CLBs and IOBs are interconnected by a programmable interconnect structure. The CLBS, IOBs, and interconnect structure are typically programmed by loading a stream of configuration data (bitstream) into internal configuration memory cells that define how the CLBS, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Conventionally, external voltage signals are provided to internal die interconnections of integrated circuits such as PLDs, application specific integrated circuits (ASICS), and others, to provide local input power to internal circuitry and integrated circuits. Unfortunately, due to variations in integrated circuit power consumption, IR drops between integrated circuits and external voltage sources can negatively affect local integrated circuit input voltage levels and therefore affect integrated circuit performance. For example, with regard to PLDs, as timing oscillator circuits may be affected by changes to input voltage levels, variations in such input voltage levels to such a timing oscillator circuit may introduce fluctuations in timing clock signal frequency that may lead to incorrect PLD operation.

Others have attempted to resolve IR drop issues by providing a global reference voltage and on-chip global power regulation at some if not all of various integrated circuits localities. However, power regulation often relies on expensive voltage regulators that consume valuable die space. Others have relied on increasing the size and number of power and ground interconnections, and in some cases providing separate power and ground planes. Unfortunately, while increasing the amount and size of the power interconnections or even adding a power and ground plane, may help reduce IR drops, it also requires the use of valuable die space and increases the complexity of the die, especially as die sizes shrink to accommodate the demand for smaller integrated circuits.

Accordingly, it would be desirable and useful to provide power regulation apparatus and method for providing a low cost stable local internal voltage. Moreover, it would be desirable and useful to provide an on-chip local voltage for one or more integrated circuits that also compensates for thermal changes of such integrated circuits during operation.

SUMMARY OF THE INVENTION

An aspect of the present invention is a method for controlling voltage provided to an integrated circuit. The method includes generating a first frequency value responsive to a first voltage, and generating a second frequency value responsive to a second voltage. The second voltage is adjusted until the second frequency value is within range of the first frequency value.

An aspect of the present invention is a method for controlling voltage provided to an integrated circuit. The method includes generating a first frequency count indicative of a first voltage, storing the first frequency count, and generating a second frequency count responsive to a second voltage. The second frequency count is compared to the first frequency count stored, and the second frequency count is adjusted using the second voltage to maintain the second frequency count within range of the first frequency count stored.

An aspect of the present invention is a method for controlling a voltage supply configured to power at least a portion of at least one integrated circuit. A first voltage is converted to a first frequency value. An output voltage of the voltage supply is converted to a second frequency value, where the second frequency value varies as a function of the output voltage. The first frequency value is compared to the second frequency value, and the output voltage is adjusted until the first frequency value and second frequency value are within a range of each other. The second frequency value is maintained within the range.

An aspect of the present invention is an apparatus to control voltage. A voltage controlled oscillator is selectively coupled to a first voltage supply having a first voltage output and second voltage supply having a second voltage output. The first voltage output and second voltage output are selectively coupled to the voltage controlled oscillator so that the output frequency of the voltage controlled oscillator is responsive to a selected one of the first voltage output and second voltage output. A voltage control loop circuit is coupled to the voltage controlled oscillator. The voltage control loop circuit is configured to compare a first frequency value of the voltage controlled oscillator associated with the first voltage output with a second frequency value associated with a second voltage output. The voltage control loop circuit adjusts the second voltage output until the second frequency value is within a range of the first frequency value.

BRIEF DESCRIPTION OF THE DRAWINGS

Accompanying drawing(s) show exemplary embodiment(s) in accordance with one or more aspects of the present invention; however, the accompanying drawing(s) should not be taken to limit the present invention to the embodiment(s) shown, but are for explanation and understanding only.

DETAILED DESCRIPTION OF THE DRAWINGS

Figure 1:
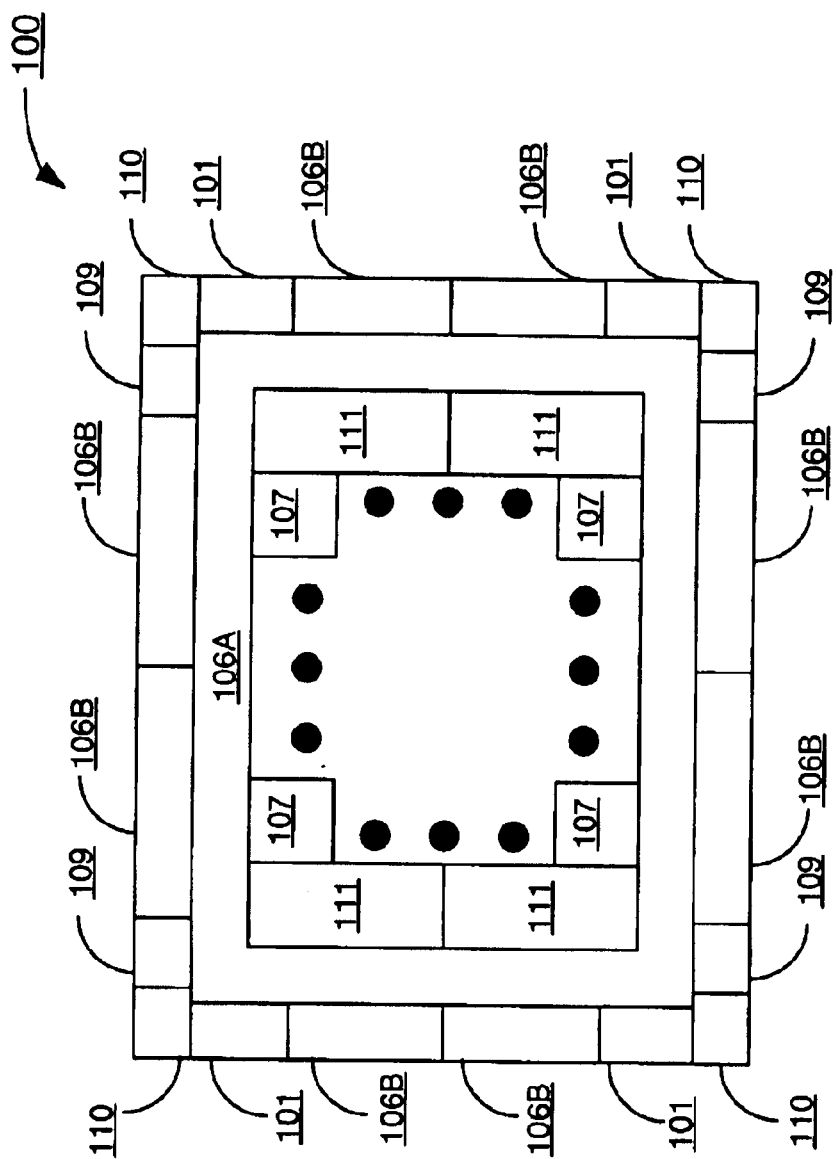
FIG. 1 is a block diagram of an embodiment of an field programmable gate array in accordance with one or more aspects of the present invention.

FIG. 1 is a block diagram of an exemplary embodiment of an FPGA 100 in accordance of one or more aspects of the present invention. FPGA 100 includes CLBs 107, I/O routing ring 106A, memory, such as random access memory 111, delay lock loops (DLLs) 109, multiply/divide/de-skew clock circuits 110, and programmable input/output blocks IOBs 106B. DLLs 109 and clock circuits 110 collectively provide digital clock modules (DCMs). FPGA 100 also includes one or more local voltage control circuits (LVCC) 101 to control a local voltage at one or more integrated circuits disposed on FPGA 100. LVCC 101 may be configured to power other types of integrated circuits and may be an independent integrated circuit.

Figure 2:
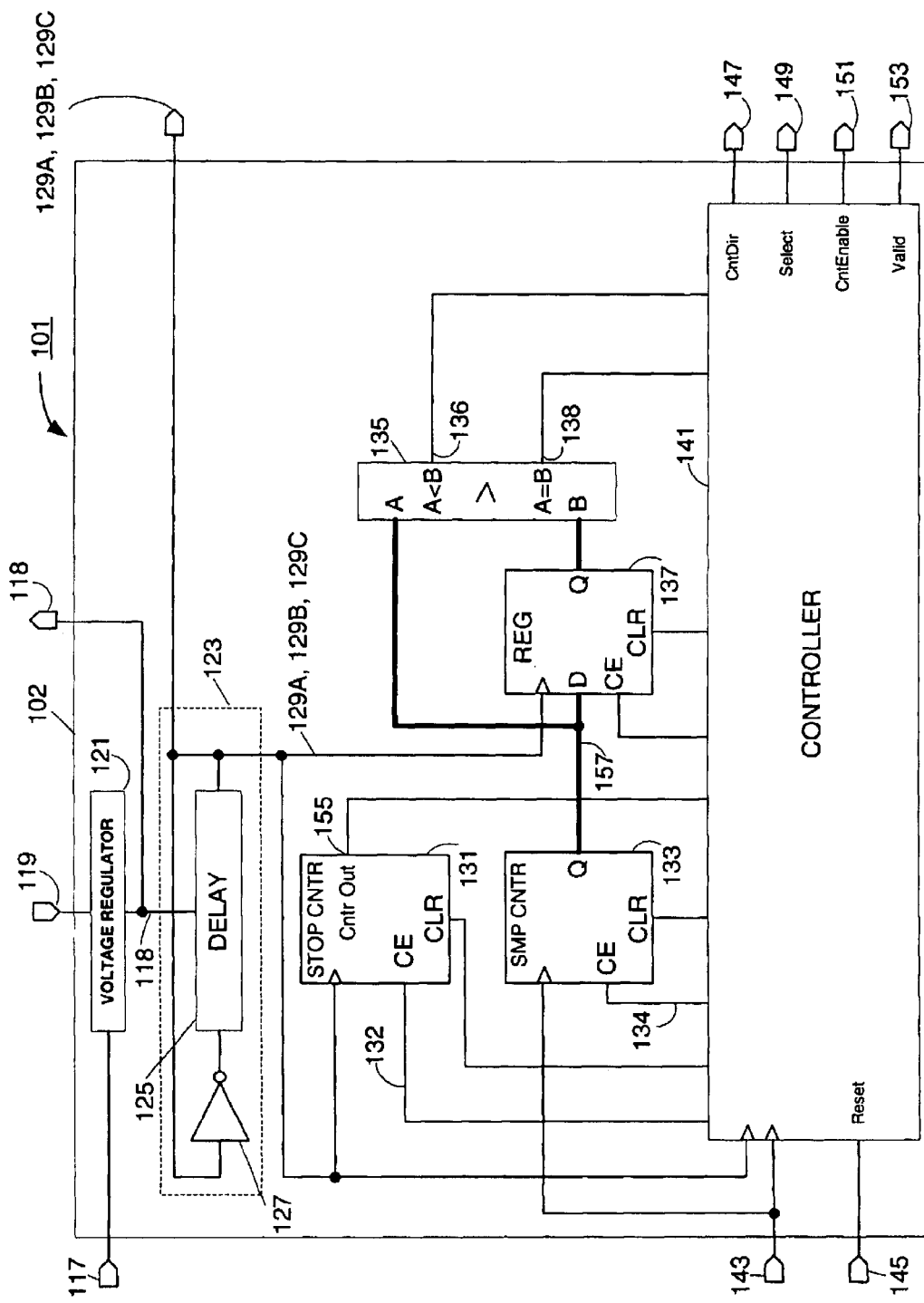
FIG. 2 is a schematic diagram of an exemplary embodiment of a local voltage control circuit in accordance with one or more aspects of the present invention.
Figure 3:
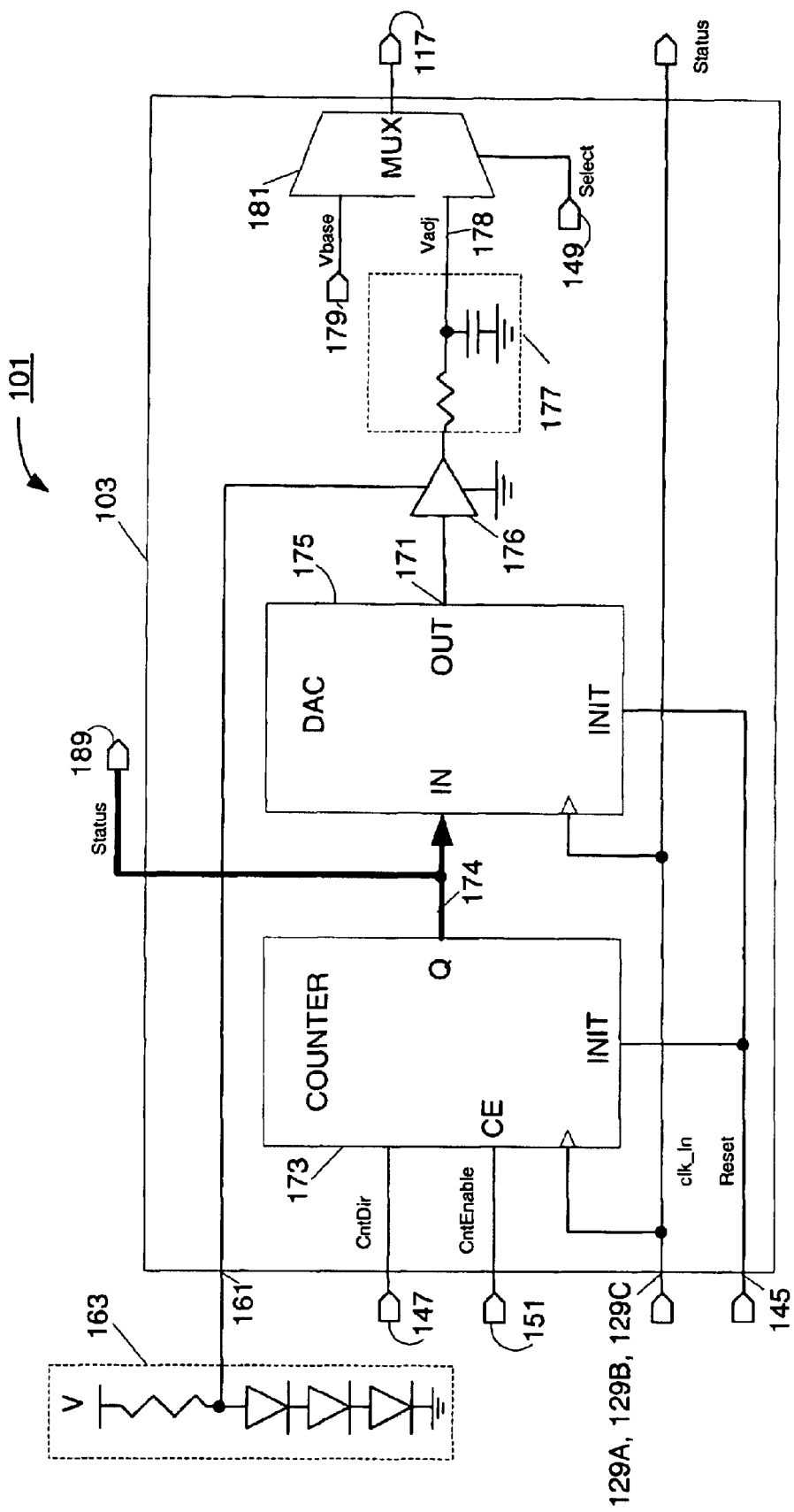
FIG. 3 is a schematic diagram of an exemplary embodiment of a voltage supply circuit for use with FIG. 2 in accordance with one or more aspects of the present invention.

FIG. 2 is a schematic diagram of an exemplary embodiment of a voltage measurement and control circuit (VMC) 102 of LVCC 101 in accordance with one or more aspects of the present invention. With continuing reference to FIG. 2, and additional reference to FIG. 3, where there is shown VMC 102 and voltage supply circuit (VSC) 103, LVCC 101 is described.

VSC 103 provides control voltage 117 to follower/regulation circuit 121. Voltage follower/regulation circuit 121 may be configured as a feedback loop response element of LVCC 101. For example, voltage follower/regulation circuit 121 may be configured to provide dampening for transients in control voltage 117. Voltage 119 may couple a supply voltage to power Voltage follower/regulation circuit 121. Voltage follower/regulation circuit 121 provides frequency control voltage 118 to voltage controlled oscillator (VCO) 123. Voltage 118 may provide voltage to other VCOs and integrated circuits (not shown). VCO 123 includes an inverter 127 and delay line 125 coupled to one another. VCO 123 oscillates at a frequency responsive to frequency control voltage 118. Alternatively, VCO 123 may be other types of known oscillators, such as voltage controlled crystal oscillators(VCXOs), among others.

VCO 123 comprises variable frequency clock signal 129 A–C coupled to clock inputs of stop counter 131 and VSC 103. Stop counter 131 counts responsive to variable frequency clock signals 129 A–C. Stop counter 131 provides stop count signal 155 to controller 141 when stop counter 131 counts to at least one stop count value, or counts to a value within a range of stop count values. Sample counter 133 counts responsive to reference clock signal 143 until stop counter 131 has counted to a stop count value. For example, sample counter 133 may count binary values until a most significant bit (MSB) of stop counter 131 has been counted. In response to a stop count value, controller 141 provides a logic signal to chip enable (CE) input 132 of stop counter 131 and CE input 134 of sample counter 133 to inhibit counting. Reference clock signal 143 may be any external or internal clock signal. Reference clock signal 143 may be used to synchronize a stop count operation to minimize counting error due to phase offset between reference clock signal 143 and variable frequency clock signals 129 A–C.

Sample counter 133 provides a sample count value from Q output to D input of snap shot register 137 via data bus 157. Sample count values are provided to A input of comparator 135 over data bus 157. Snap shot register 137 is configured to store at least one sample count value as a reference count value. Stored reference count values are provided from snap shot register 137 to B input of comparator 135. Comparator 135 includes A<B signal 136 and A=B signal 138 coupled to controller 141. Comparator 135 compares sample count values to reference count values. Logic levels of A<B signal 136 and A=B signal 138 are indicative of whether sample count values are less than or equal to reference count values. In other words, A<B signal 136 and A=B signal 138 provide a logic high or low signal to controller 141 depending upon whether a sample count value being compared is less than or equal to a reference count value. If a sample count value is neither less than or equal to a reference count value then such sample count value is greater than such reference count value.

Voltage circuit 163 provides voltage 161 to amplifier 176. Voltage circuit 163 may include a resistor diode chain. Alternatively, voltage circuit 163 may be any other type of voltage supply, including external voltage supplies, for example.

VMC 102 provides variable frequency clock signal 129A–C to clock inputs of voltage supply counter 173 and DAC 175. Voltage supply counter 173 provides variable frequency count values to DAC 175 via voltage data bus 174. Data bus 174 may couple count values to external processors over status bus 189 for data processing thereof. Variable frequency count values represent count values corresponding to variable frequency clock signal 129A–C. DAC 175 provides output voltage 171, corresponding to variable frequency count values, to an input of amplifier 176. Amplifier 176 provides an amplified adjustable output voltage (Vadj) 178, corresponding to output voltage 171, to an input of MUX 181. MUX 181 selectively couples base voltage 179, or Vadj 178, to control voltage 117 depending on a logic level of select signal 149. Base voltage 179 may be provided from an external voltage supply such as a bandgap voltage reference, and other power supplies as known. To minimize noise from DAC 175, a low pass filter 177 may be coupled between amplifier 176 and MUX 181 to filter Vadj 178. Filter 177 includes a low pass resister/capacitor network configuration. Filter 177 may be other known filter configurations.

To establish a reference count value, reset signal 145 may be used to set LVCC 101 to initial values. MUX 181 couples base voltage 179 to control voltage 117. VCO 123 provides an initial variable frequency clock signal 129A corresponding to base voltage 179. Initial variable frequency clock signal 129A clocks stop counter 131. Reference clock signal 143 clocks sample counter 133. When stop counter 131 counts to a stop count value, a sample count value of sample counter 133 is stored by snap shot register 137 as a reference count value. Such reference count values may be stored as numerical and binary values, for example.

During a voltage control loop operation, DAC 175 is set to provide Vadj 178. MUX 181 is set using voltage select signal 149 to couple Vadj 178 to control voltage 117. VCO 123 provides variable frequency clock signal 129B responsive to Vadj 178. To establish an initial control voltage 117, controller 141 may control voltage supply counter 173 to count up or down until Vadj 178 crosses or is equal to a voltage such as base voltage 179. Controller 141 process logic of A<B signal 136 and A=B signal 138. If controller 141 determines that variable frequency clock signal 129B is outside a range of a reference count value controller 141 determines a direction to count based on processing one or more sample count values. Controller 141 provides logic to count enable signal 151 and count direction signal 147 to enable voltage supply counter 173 to count up or down in a determined direction to count.

To close the feedback loop, DAC 175 provides an output voltage 171 to set a variable frequency clock signal 129B. Variable frequency clock signal 129B clocks stop counter 131. Reference clock signal 143 clocks sample counter 133. When stop counter 131 reaches a stop count value, comparator 135 compares a stored reference count value to a sample count value from sample counter 133. If such sample count value is less than a reference count value, comparator 135 provides logic of A<B signal 136 indicative thereof to controller 141. Controller 141 processes one or more sample count values to determine a direction to count. Once such count direction is determined, controller 141 provides logic level of count direction signal 147 and count enable signal 151 to enable voltage supply counter 173 to count up or down to maintain a sample count value within a range of a reference count value. When a sample count value is within a range of reference count value, controller 141 may provide valid output signal 153 indicative thereof.

In other words, LVCC 101 is configured as a feedback loop circuit. Vadj 178 is converted to a variable frequency clock signal 129A–C that clocks stop counter 131 to at least one stop count value while reference clock signal 143 clocks sample counter 133. At a stop count value, a sample count value is compared to a reference count value. If a sample count value is outside a range of a reference count value, voltage supply counter 173 is controlled by controller 141 to count up, or down, to increase or decrease Vadj 178 to maintain variable frequency clock signal 129B within such range. Controller 141 may output a valid signal 153 indicative that variable frequency clock signal 129B is within a range of initial variable frequency clock signal 129A. If variable frequency clock signal 129B varies due to factors such as thermal and IR drops, LVCC 101 compensates to maintain variable frequency clock signal 129B within a range of initial variable frequency clock signal 129A.

Figure 4:
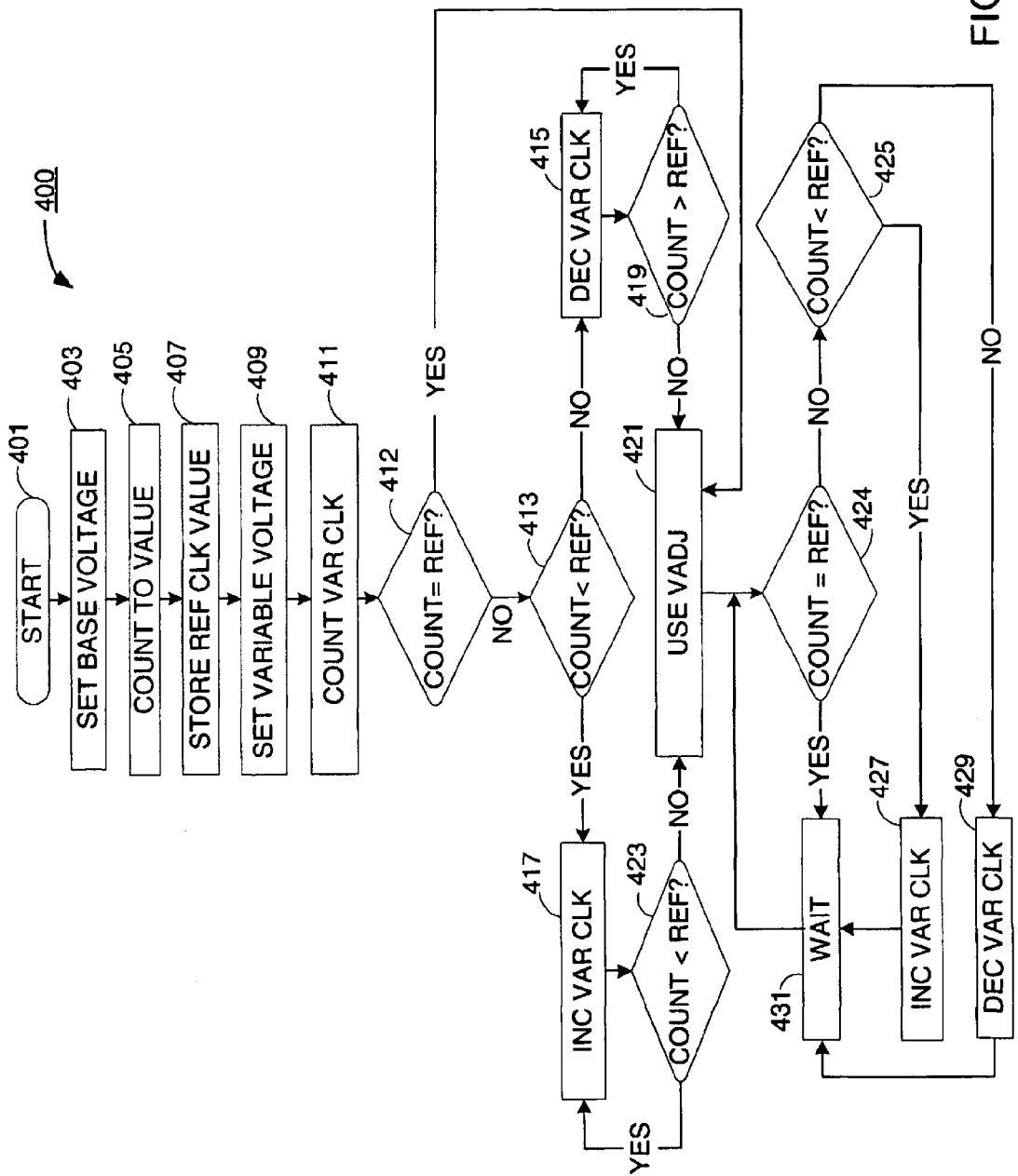
FIG. 4 is a flow diagram of an exemplary embodiment of a method to control voltage in accordance with one or more aspects of the present invention.

FIG. 4 is a flow diagram of an exemplary embodiment of a voltage control process 400 in accordance with one or more aspects of the present invention. For purposes of clarity, variable frequency (VF) is described below responsive to a variable voltage (VV) where VF increases in or decreases in frequency responsive to an increase or decrease in VV.

At 401 LVCC 101 is activated. At 403, VF is set to an initial frequency VFA corresponding to an initial voltage (VI). At 405, a reference frequency is counted until VFA is counted to a stop count value. Once an initial frequency count has been stopped, at 407 a count value (CV) of reference frequency is stored as a reference count value (RCV). At 409, VF is set to VV. At 411, a reference frequency is counted until VF reaches a stop count value and voltage control process 400 stops counting. Once counting of reference frequency stops, another count value CVA of reference frequency is compared to RCV at 412. At 412, if CVA is equal to RCV then voltage control process 400 proceeds to 421. If at 412 CVA is not equal to RCV then voltage control process 400 proceeds to 413. At 413, if CVA is less than RCV, then at 417 VV increases VF. At 423, if CVA is less than RCV, voltage control process 400 loops back to 417. However, at 423 if CVA is greater than or equal to RCV, then at 421 VV is set available, and voltage control process 400 proceeds to 424. If at 413, CVA is greater than RCV, then at 415 VV decreases VF. At 419, if CVA is greater than RCV, voltage control process 400 loops back to 415. However, if at 419 CVA is less than or equal to RCV, then at 421, VV is set as available, and voltage control process 400 proceeds to 424. In this embodiment, voltage control process 400 detects CVA crossing or equaling RCV.

At 424 CVA is compared to RCV. If at 424 CVA is equal to RCA, then voltage control process 400 proceeds to 431. If CVA is not equal to RCV then voltage control process 400 proceeds to 425. At 425 CVA is compared to RCV. If at 425 CVA is less than a range of RCV, then at 427 VV increases VF. After waiting for a period of time at 431, voltage control process 400 returns to 424. At 425 if CVA is greater than a range of RCV, then at 429 VV decreases VF. After waiting for a period of time at 431, voltage control process 400 returns to 424. In this embodiment, method 400 adjusts VV to maintain CVA within a range of RCV corresponding to a voltage range of VV. Voltage control process 400 may include averaging a number of CVA values to average out any measurement ambiguity. Voltage control process 400 may include discarding a number of erroneous CVA values to correct out any measurement ambiguity.

While the foregoing describes exemplary embodiment(s) in accordance with one or more aspects of the present invention, other and further embodiment(s) in accordance with the one or more aspects of the present invention may be devised without departing from the scope thereof, is determined by the claim(s) that follow and equivalents thereof. Claim(s) listing steps do not imply any order of the steps.

What is claimed is:

1. A method for controlling voltage provided to an integrated circuit, comprising:

generating a first frequency value responsive to a first voltage;

generating a second frequency value responsive to a second voltage; and adjusting the second voltage until the second frequency value is within range of the first frequency value; and powering the integrated circuit with the second voltage.

2. The method of claim 1, wherein the generating of the first frequency value comprises associating the first frequency value with a frequency from a voltage controlled oscillator controlled by the first voltage.

3. The method of claim 2, further comprising:

storing the first frequency value; and comparing the second frequency value to the first frequency value stored.

4. The method of claim 2, further comprising comparing the second frequency value to a stored first frequency value.

5. The method of claim 4, wherein powering the integrated circuit with the second voltage occurs when the second frequency value is within range of the stored first frequency value.

6. A method for controlling voltage provided to an integrated circuit, comprising:

generating a first frequency count indicative of a first voltage;

storing the first frequency count;

generating a second frequency count responsive to a second voltage;

comparing the second frequency count to the first frequency count stored; and adjusting the second frequency count using the second voltage so that the second frequency count is within a frequency range of the first frequency count stored.

7. The method of claim 6, wherein the generating of the first frequency count comprises setting a voltage control oscillator with the first voltage to provide a first frequency to be counted.

8. The method of claim 6, wherein the storing of the first frequency comprises:
   counting the first frequency; and
   storing a first frequency count value.

9. The method of claim 6, wherein the generating of the second frequency comprises controlling a voltage control oscillator with the second voltage to provide the second frequency count.

10. The method of claim 6, wherein the comparing comprises:
   generating a first binary value for the first frequency count stored; and
   comparing the first binary value to a second binary value indicative of the second frequency count to determine a difference.

11. The method of claim 10, further comprising when the first binary value is outside a binary range of the second binary value, adjusting the second voltage until the second binary value is within the binary range.

12. The method of claim 6, wherein the adjusting of the second voltage comprises increasing and decreasing the second voltage until the second frequency count is within the frequency range of the first frequency count.

13. A method for controlling a voltage supply configured to power at least a portion of at least one integrated circuit, comprising:
   converting a first voltage to a first frequency value;
   converting an output voltage of the voltage supply to a second frequency value, wherein the second frequency value varies as a function of the output voltage;
   comparing the first frequency value to the second frequency value;
   adjusting the output voltage until the first frequency value and the second frequency value are within a range; and
   maintaining the second frequency value within the range of the first frequency value.

14. The method of claim 13, wherein the converting of the first voltage comprises measuring the first frequency to determine a value.

15. The method of claim 13, wherein the converting of the output voltage comprises measuring the second frequency to determine a value.

16. The method of claim 13, wherein the comparing comprises determining a difference between the second frequency value and the first frequency value.

17. The method of claim 13, wherein the adjusting comprises increasing and decreasing the output voltage to vary the second frequency value.

18. An apparatus to control voltage, comprising:
   a voltage controlled oscillator;
   a first voltage supply having a first voltage output;
   a second voltage supply having a second voltage output;
   the first voltage output and second voltage output selectively coupled to the voltage controlled oscillator, the voltage controlled oscillator having an output frequency responsive to a selected one of the first voltage output and the second voltage output;
   a voltage control loop circuit coupled to the voltage controlled oscillator and configured to:
      compare a first frequency value of the voltage controlled oscillator associated with the first voltage output with a second frequency value associated with second voltage output; and
      adjust the second voltage output until the second frequency value is within a range of the first frequency value.

19. The apparatus of claim 18, wherein the voltage control loop circuit comprises a frequency counting circuit configured to count the output frequency.

20. The apparatus of claim 18, wherein the voltage control circuit comprises a frequency measurement storage circuit to store the first frequency value.

21. The apparatus of claim 18, wherein the voltage control circuit comprises a frequency comparison circuit configured to measure a first frequency associated with the first frequency value and a second frequency associated with the second frequency value and to provide a voltage control signal to the second supply indicative of a difference between the first frequency value and the second frequency value.

22. The apparatus of claim 18, wherein the frequency comparison circuit comprises a frequency measurement storage circuit configured to store the first frequency value as a first binary value.

23. The apparatus of claim 18, wherein the frequency comparison circuit further comprises a binary comparison circuit configured to compare the first binary value to a second binary value indicative of the second frequency value.

* * * * *